US011527390B2

United States Patent
Hwang et al.

(10) Patent No.: US 11,527,390 B2
(45) Date of Patent: Dec. 13, 2022

(54) BASE CONDUCTING LAYER BENEATH GRAPHITE LAYER OF CERAMIC CATHODE FOR USE WITH CATHODIC ARC DEPOSITION

(71) Applicant: Western Digital Technologies, Inc., San Jose, CA (US)

(72) Inventors: Cherngye Hwang, San Jose, CA (US); Reimar Azupardo, Santo Tomas Batangas (PH); Randall Simmons, San Jose, CA (US); Mary Agnes Gupit Perez, Paranaque (PH)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/592,350

(22) Filed: Feb. 3, 2022

(65) Prior Publication Data
US 2022/0157571 A1  May 19, 2022

Related U.S. Application Data

(63) Continuation of application No. 16/583,121, filed on Sep. 25, 2019, now Pat. No. 11,270,872.

(51) Int. Cl.
*H01J 37/32*    (2006.01)
*C23C 14/06*   (2006.01)
(Continued)

(52) U.S. Cl.
CPC .... *H01J 37/32614* (2013.01); *C23C 14/0611* (2013.01); *C23C 14/325* (2013.01);
(Continued)

(58) Field of Classification Search
CPC ..... H01J 39/2403; H01L 39/12; H01L 27/18; H01L 39/2493; H01L 39/223;
(Continued)

(56) References Cited

U.S. PATENT DOCUMENTS 4,695,404 A      9/1987  Kwong
4,714,860 A  *  12/1987  Brown ................ H01J 27/14
                                              313/231.71
(Continued)

FOREIGN PATENT DOCUMENTS

CN         2735703 Y    10/2005
CN       202181346 U     4/2012
(Continued)

OTHER PUBLICATIONS

Ted Pella, Inc., SEM Paint, Paste, Aerosol—Conductive Adhesive, Mar. 24, 2010, https://web.archive.org/web/20100324145633/https://www.tedpella.com/SEMmisc_html/SEMpaint.htm (Year: 2010).*
(Continued)

*Primary Examiner* — Jennifer Wecker
*Assistant Examiner* — Patrick S Ott
(74) *Attorney, Agent, or Firm* — Loza & Loza, LLP; Gabriel Fitch

(57) ABSTRACT

Cathode structures are disclosed for use with pulsed cathodic arc deposition systems for forming diamond-like carbon (DLC) films on devices, such as on the sliders of hard disk drives. In illustrative examples, a base layer composed of an electrically- and thermally-conducting material is provided between the ceramic substrate of the cathode and a graphitic paint outer coating, where the base layer is a silver-filled coating that adheres to the ceramic rod and the graphitic paint. The base layer is provided, in some examples, to achieve and maintain a relatively low resistance (and hence a relatively high conductivity) within the cathode structure during pulsed arc deposition to avoid issues that can result from a loss of conductivity within the graphitic paint over time as deposition proceeds. Examples of suitable base material compounds are described herein
(Continued)

where, e.g., the base layer can withstand temperatures of 1700° F. (927° C.).

17 Claims, 18 Drawing Sheets

(51) Int. Cl.
    *C23C 14/54*     (2006.01)
    *C23C 14/32*     (2006.01)
    *G11B 5/85*     (2006.01)

(52) U.S. Cl.
    CPC .............. *C23C 14/542* (2013.01); *G11B 5/85* (2013.01); *H01J 37/3255* (2013.01); *H01J 37/32064* (2013.01)

(58) Field of Classification Search
    CPC . C23C 14/0036; C23C 14/02; C23C 14/0682; C23C 14/165; C23C 14/325; H01J 27/08; H01J 27/14; H01J 49/126; H01J 49/12; Y10S 977/844; B05D 1/18; B05D 7/225; B05D 2254/06
    USPC ........................................ 204/192.38, 298.21
    See application file for complete search history.

(56) References Cited

U.S. PATENT DOCUMENTS

| | | | |
|---|---|---|---|
| 4,978,610 A * | 12/1990 | Forrest ................. | G01N 33/532 436/526 |
| 5,580,429 A | 12/1996 | Chan et al. | |
| 6,548,817 B1 | 4/2003 | Anders et al. | |
| 6,956,718 B1 | 10/2005 | Kulkarni et al. | |
| 7,170,228 B2 | 1/2007 | Hecker et al. | |
| 8,021,768 B2 | 9/2011 | Ge | |
| 8,157,976 B2 | 4/2012 | Druz et al. | |
| 9,747,929 B2 | 8/2017 | Torres et al. | |
| 9,805,748 B1 | 10/2017 | Gong et al. | |
| 9,886,973 B2 | 2/2018 | Miyata et al. | |
| 10,083,713 B1 | 9/2018 | Simmons et al. | |
| 2002/0134672 A1 | 9/2002 | Hwang et al. | |
| 2005/0100497 A1 | 5/2005 | Smalley et al. | |
| 2005/0148200 A1 | 7/2005 | Kijima et al. | |
| 2005/0257643 A1 | 11/2005 | Ogi et al. | |
| 2009/0065350 A1 | 3/2009 | Anders | |
| 2011/0056839 A1 | 3/2011 | Medina et al. | |
| 2014/0126113 A1 | 5/2014 | Ogiwara | |
| 2016/0260583 A1 | 9/2016 | Balzano et al. | |
| 2017/0101722 A1 | 4/2017 | Gao et al. | |
| 2017/0369984 A1 | 12/2017 | Druz et al. | |

FOREIGN PATENT DOCUMENTS

| | | |
|---|---|---|
| EP | 1046726 A2 | 10/2000 |
| JP | H09217165 A | 8/1997 |

OTHER PUBLICATIONS

Duba et al.; "The Brittle-Ductile Transition in Rocks: The Heard Volume;" Copyright 1990; American Geophysical Union; Washington, DC; ISBN 0-87590-025-9; 5 pages; <https://bit.ly/2llzKgZ>.

Aremco; "Electrically and Thermally Conductive Adhesives and Coatings;" accessed Sep. 20, 2019; 5 pages; <https://www.aremco.com/conductive-compounds/>.

SPI Supplies; "Carbon Conductive Paint;" Structure Probe, Inc; accessed Sep. 20, 2019; 4 pages; <https://www.2spi.com/item/z05006/>.

Ted Pella, Inc.; "SEM Paint, Paste, Aerosol—Conductive Adhesive;" Mar. 24, 2010; https://web.archive.org/web/20100324145633/https://www.tedpella.com/SEMmisc_html/SEMpaint.htm (Year: 2010); 11 pages.

International Search Report and Written Opinion for International Application No. PCT/US2020/025045, dated Jul. 13, 2020, 9 pages.

* cited by examiner

Cross-section of an End of Coated Ceramic Cathode Tube/Rod

BASE CONDUCTING LAYER BENEATH GRAPHITE LAYER OF CERAMIC CATHODE FOR USE WITH CATHODIC ARC DEPOSITION

CROSS-REFERENCE TO RELATED APPLICATIONS

This application is a continuation of U.S. patent application Ser. No. 16/583,121, filed Sep. 25, 2019, entitled "BASE CONDUCTING LAYER BENEATH GRAPHITE LAYER OF CERAMIC CATHODE FOR USE WITH CATHODIC ARC DEPOSITION," the entire content of which is incorporated herein by reference.

FIELD

The disclosure relates, in some embodiments, to cathodes for use with pulsed cathodic arc deposition. More specifically, but not exclusively, the disclosure relates to ceramic cathodes for forming diamond-like carbon films on devices such as the sliders of hard disk drives.

INTRODUCTION

Pulses cathodic arc deposition is a type of physical vapor deposition in which an electric arc vaporizes material such as graphite that is coated on a cathode structure. The vaporized material propagates to and condenses on a device or substrate to form a thin film. One type of film that can be formed via cathodic arc deposition is a diamond-like carbon (DLC) film, which may be formed, for example, on the sliders of hard disk drives (HDDs) or on other devices that benefit from an extremely hard and durable protective film or coating. It would be desirable to provide improved methods and apparatus for cathodic arc deposition for forming DLC films or other films or coatings.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of this disclosure provides a cathode structure for use in a deposition system, the cathode structure comprising: a ceramic structure; a first layer formed on the ceramic structure and comprising an electrically-conducting material that adheres to the ceramic structure; and a second layer formed on the first layer and comprising carbon.

Another embodiment of the disclosure provides a method for forming a film, the method comprising: passing an electrical current through a ceramic structure; passing the electrical current through a base layer formed on the ceramic structure and comprised of an electrically-conducting material that adheres to the ceramic structure; and passing the electrical current through an outer layer formed on the base layer and comprised of carbon to cause at least some of the carbon to be transferred to a device to form a film on the device.

Yet another embodiment of the disclosure includes a deposition apparatus comprising: an anode; a cathode comprising a ceramic structure, a first layer formed on the ceramic structure and comprised of an electrically-conducting material that adheres to the ceramic structure, and a second layer formed on the first layer and comprised of carbon; a power supply coupled to the cathode and configured to cause the cathode to generate a plasma that includes carbon particles; an electrode on which a device to receive a carbon film is mounted; a pulse generator connected with the electrode to apply a bias pulse; and a controller configured to control the power supply and the pulse generator.

DETAILED DESCRIPTION

Figure 1:
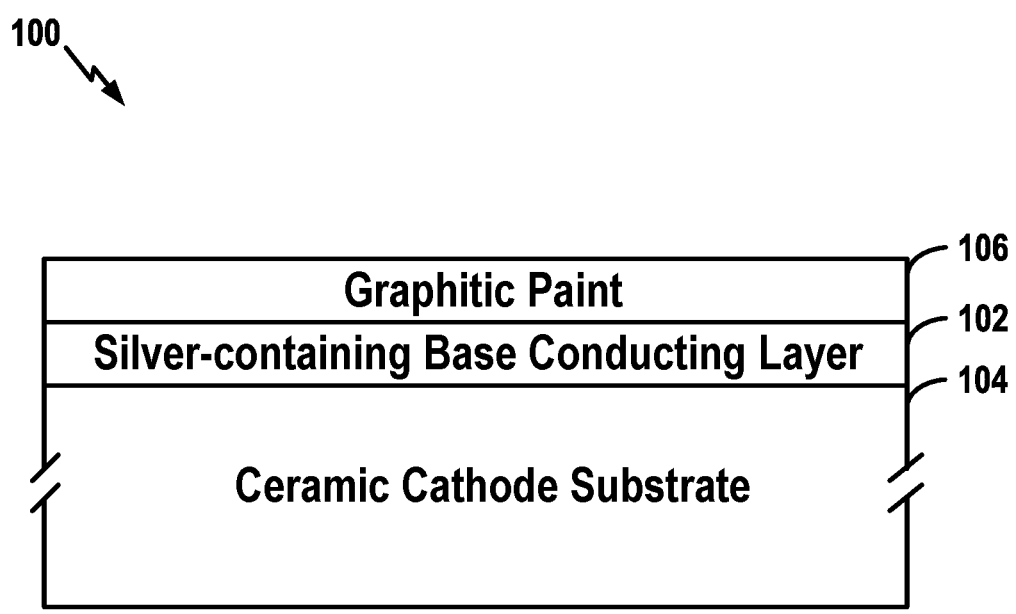
FIG. 1 illustrates an exemplary cathode structure for use in a pulsed cathodic arc deposition system or apparatus where the cathode structure includes a base conducting layer.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Aspects described herein are directed to cathodic arc deposition structures, methods and apparatus. In at least some cathodic arc deposition systems, particularly pulses cathodic arc systems, a conducting path between a ceramic cathode rod and the anode of the system is via a thin layer of graphite coated onto the ceramic rod, which may be, e.g., a graphite-filled paint or graphitic paint. In use, carbon is emitted from the graphite coating and deposited on a device to form a DLC film on the device (which may be, for example, the slider of a HDD). The graphite coating of the cathode rod can be affected by the arc pulsing process and, for example, can lose conductivity over time and cause the deposition process to become unstable, which might result in unsatisfactory DLC films. In particular, a loss of conductivity can result in a poor quality carbon plume during deposition, which in turn may result in a degradation of the properties of the DLC film and/or a loss of uniformity in the DLC film thickness. If satisfactory conductivity is not maintained, the deposition process may need to be suspended so that no unsatisfactory DLC films are formed, with the deposition process then restarted once a new cathode rod has been installed. If the problem is not detected before the DLC films are formed, the devices upon which the films are deposited may need to be discarded. Attempts to remedy these problems by modifying the graphite coating and/or the manner by which it is applied to the cathode rod have, thus far, been largely unsuccessful and so a different solution is disclosed and described herein.

Herein structures, methods and apparatus are disclosed where, e.g., a layer of electrically-conducting material is provided between the ceramic cathode rod and the graphite coating, where the electrically-conducting material is formed of a material such as a silver-containing (or silver-filled) coating that adheres to the ceramic rod (permanently or at least for a sufficiently long time for practical purposes). (By a silver-containing or silver-filled coating, it is meant that the coating includes at least some silver among its other constituents, such as an amount of silver in the range of 10% to 90% of the coating, e.g. 10%, 50%, 75%, etc. For a particular application, a suitable or efficacious percentage of the silver can be determined via otherwise routine testing to achieve target electrical and/or thermal characteristics, such as a target conductivity. Particular examples are described below.) The electrically-conducting material is also thermally-conducting. This coating is referred to herein as a "base" coating or layer because it is formed or applied below the graphite layer and forms a base for that layer. The base conducting layer may also be referred to as an "intermediate" coating or layer since it is intermediate between the ceramic of the cathode rod and the graphite coating (which may be painted onto or coated over the base layer to form an over layer). The combination of the base coating and the graphite coating may be referred to as a two-layer coating, a dual-layer coating, or a multiple layer coating or other suitable terms.

Figure 2:
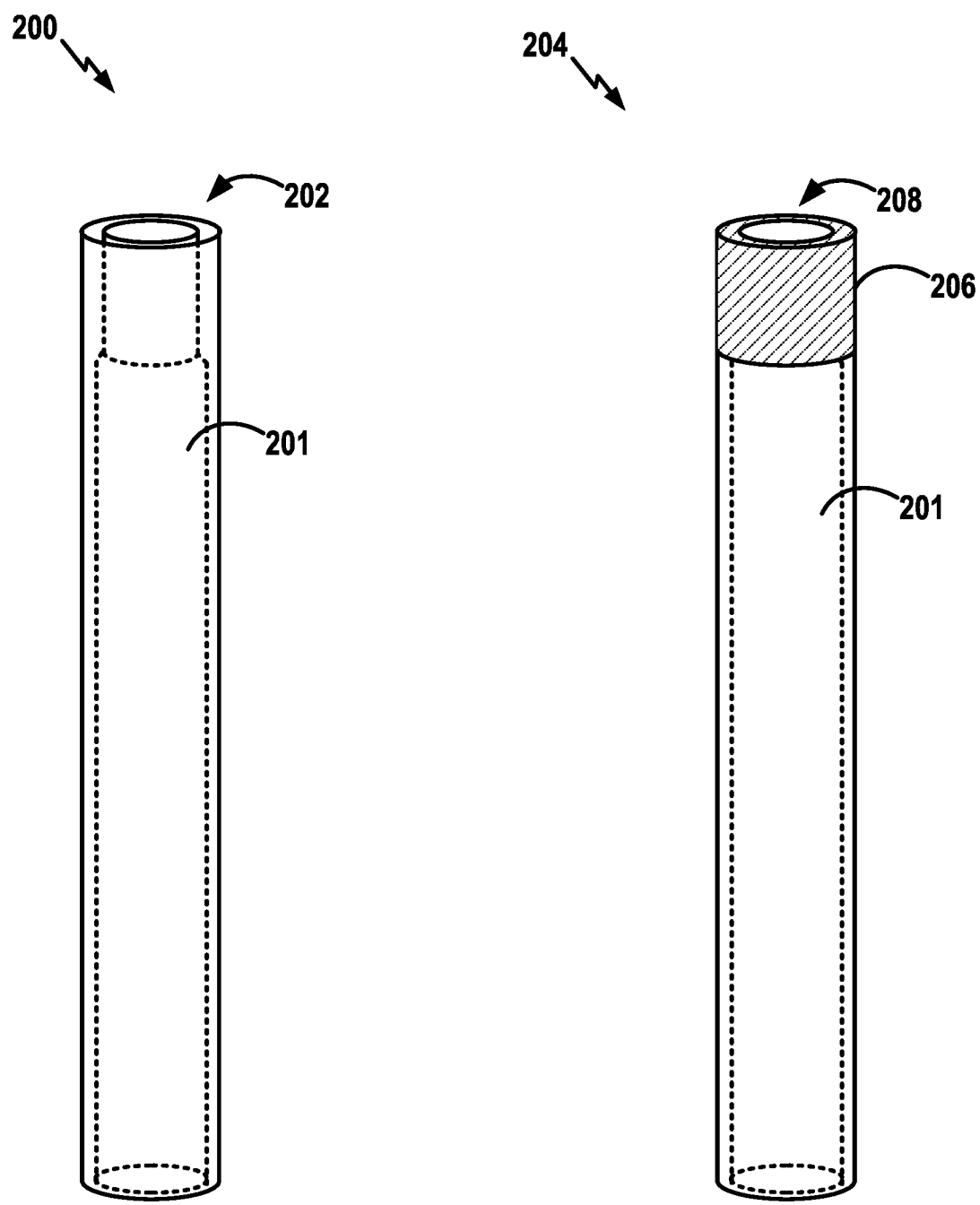
FIG. 2 illustrates exemplary rod-shaped cathodes, including a bare ceramic cathode and a ceramic cathode with a base conducting layer and an outer graphitic paint layer coated thereon.

FIG. 1 illustrates an exemplary cathode structure 100 that includes a silver-containing base electrically-conducting layer or coating 102 between a ceramic substrate 104 of the cathode and a graphitic paint 106. In implementations where the ceramic substrate of the cathode is in the shape of a tube, the ceramic substrate itself and the layers coated thereon may be curved and the silver-containing base layer 102 and the graphitic paint 106 may be applied to coat both the outer surface of a distal end of the ceramic and an inner surface of the distal end of the ceramic (as shown in FIG. 2, discussed below). The silver-containing base conducting layer 102 is employed, at least in part, to provide a more consistent and stable conductivity path between the anode and ceramic rod of the cathode. This, in turn, can yield a more stable arcing process over the course of one or more cathode rod life cycles. That is, in use, the silver-containing base conducting layer provides a substantially uniform, stable, and consistent conductive path for the arcing process to avoid or mitigate the loss of conductively problems discussed above. The silver-containing base conducting layer may be referred to as conductivity-path enhancement coating or layer, middle layer, intervening layer, buffer layer, an intermediate or intermediary coating or layer, or by any other suitable terms. Silver is just one example of a conducting material that may be used in the base conducting layer. Other examples are discussed below where the material may be, for example, nickel, copper or gold.

In some illustrative examples described herein, the silver-containing base conducting layer is a high temperature-tolerant electrically and thermally conductive silver flake coating. By high temperature-tolerant, it is meant that the material tolerates high temperatures, such as temperatures greater than 500° F. without significant loss of its adherent and conductivity properties. In some examples, the silver-containing base conducting layer is an adhesive or coating formed of materials that can withstand 1700° F. (927° C.), which is substantially higher than the temperatures often used during cathodic arcing to form DLC films (which are often less than 500° F.). One particular example of a suitable high temperature-tolerant silver-containing base coating is the Pyro-Duct™ 597-C coating provided by Aremco Products, Inc. (where Pyro-Duct™ is a trademark of Aremco Products, Inc.). Pyro-Duct™ 597-C is composed of high purity silver flake with a D50 particle size of less than twenty microns and the material has a volume resistivity of about 0.0002 ohm-cm at room temperature. (Particle Size Distribution D50 is also known as the median diameter or medium value of the particle size distribution, that is, it is the value of the particle diameter at 50% in the cumulative distribution.) All constituents of Pyro-Duct™ 597-C are electrically and thermally conductive. It may be applied, for example, by dipping, brushing or with a spray gun.

The silver-containing coating may be applied using the same or similar techniques used to apply the graphitic paint conducting layer 106 with a baking process used for curing the layers, as described below. The illustrative coating material (Pyro-Duct™ 597-C) is a water base adhesion/coating, which has been found to provide excellent adhesion to ceramic cathode rods formed of aluminum oxide ($Al_2O_3$) or beryllium oxide (BeO, also called beryllia). The thickness of the base coating may be selected or adjusted to achieve a selected or desired conductivity.

Exemplary Cathode Rod with Base Coating

FIG. 2 illustrates a bare or uncoated ceramic cathode tube or rod 200 formed of a ceramic material 201 and having an open distal end 202 and a similar ceramic cathode tube or rod 204 on which a two-layer coating 206 has been applied to its open distal end 208, where the two-layer coating 206 includes the aforementioned outer graphitic paint layer and the silver-containing base conductive layer. It is noted that, in the figure, the silver-containing base conductive layer of two-layer coating 206 is obscured from view because it is beneath the graphitic paint (which is shown using a diagonal hatch pattern). It is also noted that both the inner and outer surfaces of the open distal end 208 of the ceramic tube 204 are coated with the two-layer coating 206.

Figure 3:
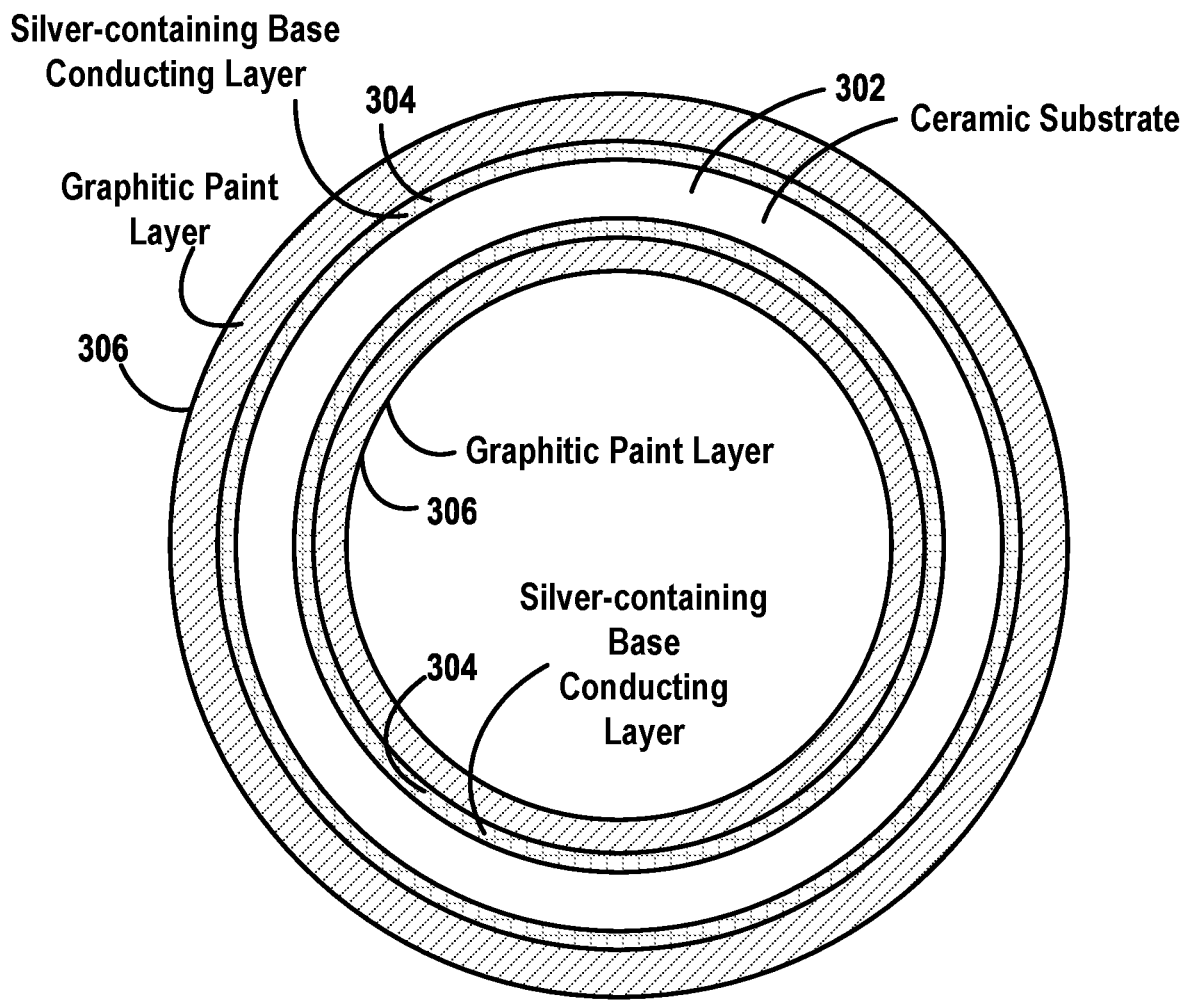
FIG. 3 illustrates a cross-section of a distal end of the exemplary rod-shaped cathode of FIG. 2 with the cross-section taken perpendicular to a long axis of the cathode.
Figure 4:
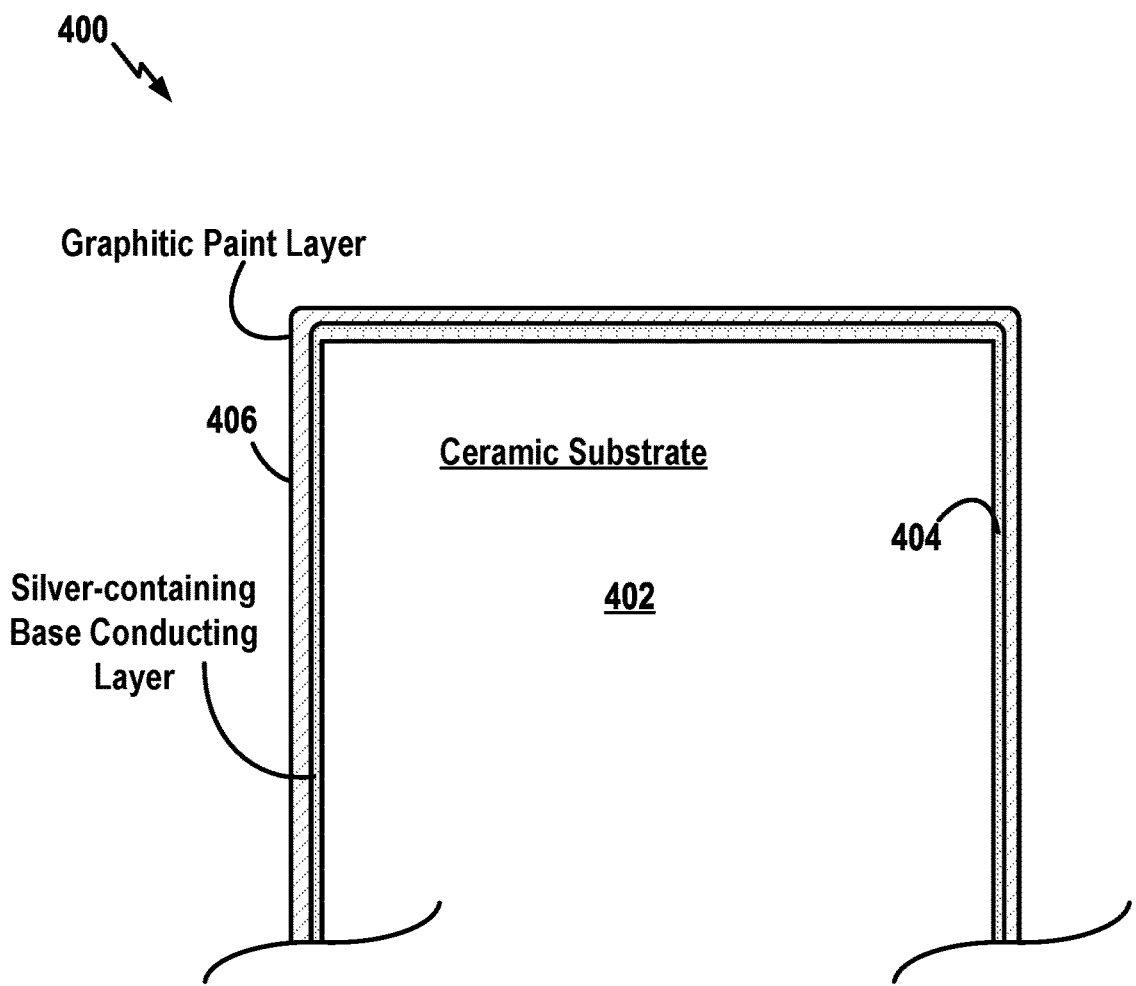
FIG. 4 illustrates a longitudinal cross-section of one side of the distal end of the exemplary rod-shaped cathode of FIG. 2 with the cross-section taken parallel to the long axis.

FIG. 3 is a cross-sectional illustration of a slice of the distal end of an exemplary cathode rod or tube 300 having a ceramic substrate 302 shaped in the form of a tube or cylinder, with the cross-section taken through the distal end and perpendicular to a long axis of the tube. A thin silver-containing base conducting layer 304 (shown using a square cross-hatch pattern) is formed or coated onto both the inner and outer surfaces of the open distal end of the ceramic substrate 302. A graphitic paint layer 306 (shown again using a diagonal hatch pattern) is formed or coated onto the conducting layer 304. (As shown in FIG. 4, discussed below, the graphitic paint layer and the silver-containing base conducting layer may extend around the distal terminus of the tube to form continuous coatings.) Note that the illustration of FIG. 3 is not to scale.

In implementations where the cathode rod 300 is used in cathodic arc deposition, the ceramic substrate 302 is often much thicker than the graphitic paint layer 306, which, in turn, is often much thicker than the silver-containing base conducting layer 304. In some examples, the thickness of the various components and layers are: the ceramic substrate 302 thickness is in the range of 2.7 mm to 2.8 mm; the silver-containing base conducting layer 304 thickness is in the range of 0.015 mm to 0.02 mm; the graphitic paint layer 306 thickness is in the range of 0/02 mm to 0.03 mm. Note also that to allow one to more easily distinguish the various components and layers in FIG. 3, the graphitic paint layer 306 is shaded dark gray, the silver-containing base layer 304 is shaded as a lighter gray, and the ceramic substrate 302 is shaded using a still lighter gray. The hues shown in the figure do not necessarily correspond to the actual colors of the components in a practical device.

FIG. 4 is a cross-sectional illustration of one end portion of the distal end an exemplary cathode rod or tube 400 such as one configured as in FIG. 2, with the cross-section taken parallel with a long axis of the tube. As shown, the silver-containing base conductive layer 404 (shown again using a square cross-hatch pattern) and the graphitic paint layer 406 (shown again using a diagonal hatch pattern) extend around a distal end of the ceramic substrate 402. Note that FIG. 4 shows a cross section through only one portion of the distal end of cylindrical ceramic tube. The diametrically opposite portion is not shown in FIG. 4 but has the same components and layers. The illustration of FIG. 4 is not to scale.

Exemplary Application and Curing Process

Figure 5:
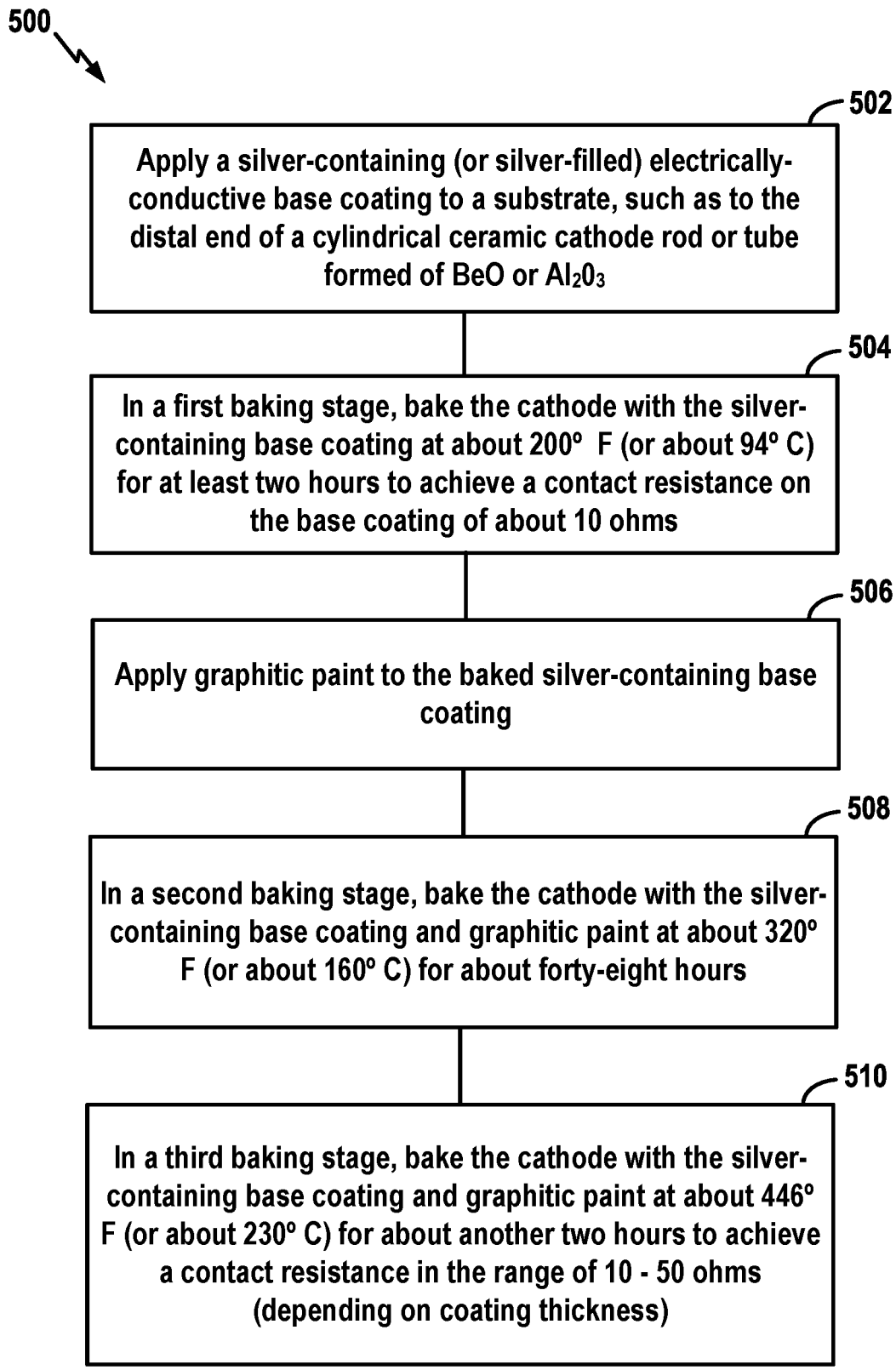
FIG. 5 is a flow chart summarizing an exemplary method or procedure for coating and baking a ceramic cathode, such as the cathodes of FIGS. 1-4.

FIG. 5 is a flow diagram illustrating an exemplary method or procedure 500 for coating and baking a ceramic cathode, such as the coated cathodes shown in FIGS. 1-4, or other substrates. At block 502, a technician or a suitably-programmed apparatus applies a silver-containing electrically conductive coating to a substrate, such as to the distal end of a cylindrical ceramic cathode rod or tube formed of BeO or $Al_2O_3$. The silver-containing electrically conductive coating may be painted onto the cathode or applied using any suitable application technique. In some examples, the silver-containing electrically conductive coating is the Pyro-Duct™ 597-C coating noted above. At block 504, a suitable oven or other heating system is used to bake the cathode with the silver-containing coating at about 200° F. (or about 94° C.) for at least two hours to achieve a contact resistance of about 10 ohms. The baking procedure of block 504 may be regarded as a first baking stage. At block 506, the technician or the suitably-programmed apparatus applies a graphitic paint to the baked silver-containing coating, which may be achieved by painting the graphitic material onto the silver-containing coating or by using any other suitable method of application, such as dipping the distal end of the cathode into a vessel containing the graphitic paint in fluid form.

At block 508, a suitable oven or other heating system is used to bake the cathode with the silver-containing coating and graphitic paint at about 320° F. (or about 160° C.) for about forty-eight hours. This is considerably longer than some alternative baking procedures that might instead bake the graphitic paint for only one to four hours. The process of FIG. 5 also uses a somewhat lower baking temperature than some alternative baking procedures that might instead bake at 260° C. The baking procedure of block 508 may be regarded as a second baking stage. At block 510, the oven is used to bake the cathode with the silver-containing coating and graphitic paint at about 446° F. (or about 230° C.) for about another two hours to achieve a contact resistance in the range of 10-50 ohms (depending on coating thickness). The baking procedure of block 504 may be regarded as a third baking stage. As noted above, the exemplary silver-containing coating material (Pyro-Duct™ 597-C) can withstand up to 1700° F. (927° C.) and so it can easily withstand the 446° F. of the third baking stage. If a different conducting material is used as the base coating layer, care should be taken to choose a material that can withstand a high baking temperature (as may be useful to achieve a particular desired or target electrical resistance). A particular example of a suitable graphitic paint is Part No: SPI#05006-AB provided by Structure Probe, Inc. (SPI) of West Chester, Pa. For practical purposes, it is often desirable to achieve and maintain a relatively low contact resistance (and hence a relatively high conductivity) within the distal end coating of the cathode used for pulsed arc deposition. This is to avoid the issues discussed above that can result from a loss of conductivity within the coating. For example, it may be desirable to achieve and maintain a contact resistance below 300 ohms over hundreds of thousands of pulse cycles. In some examples, a test cathode coated and baked using the procedure of FIG. 5 (with Pyro-Duct™ 597-C as the silver-containing base layer beneath a layer of graphitic paint) was found to maintain a contact resistance of less than 300 ohms for over 140,000 pulses. In contrast, a test cathode using the same graphitic paint (baked at two hours at about 260° C.) but without the silver-containing base coating was found to reach 300 ohms after less than 50,000 pulses. As discussed above, a loss of conductivity may require suspending the deposition procedure and then restarting the procedure with a new cathode. And so maintaining satisfactory conductivity over a long pulse count lifetime is beneficial. It should be noted that the actual contact resistance values may depend on the thickness and uniformity of the various coatings and the particular locations on the cathode where contact resistance is measured, as well as on the particular ceramic material of the cathode. In some test cathodes, BeO was found to result in lower contact resistance values than $Al_2O_3$. Generally speaking, baked coatings can provide lower resistance values than non-baked coatings. Also, generally speaking, it is noted that the highly resistive top graphite coating layer used as part of the cathode during deposition operates to "mask" the underlying silver paint layer to prevent it from "seeing" the arcing and causing contamination in resulting DLC films.

Cathodes of the type formed as described herein may be used in a variety of different pulsed cathodic arc deposition machines or other deposition systems, machines or apparatus. In some particular examples, the cathode is used within the NEXUS DLC-X Diamond-Like Carbon System of Veeco Instruments Inc. or other systems of devices of Veeco Instruments Inc.

Other metals that may be appropriate for use in the base layer of the cathode include copper, gold, and nickel, or combinations thereof, or other transition metals that have sufficiently high melting points and appropriate conductance values. For example, depending upon the particular metal, flakes or particles of the metal may be suspended or mixed within a suitable coating or adhesive compound. Otherwise routine experimentation may be performed to identify combinations of metals and suspension compounds that together achieve and maintain sufficient conductivity and sufficient adherence to the ceramic substrate and to the graphite overlayer to withstand the temperatures needed for use with particular deposition systems. Otherwise routine experimentation may be used to identify particular baking temperatures and durations for selected combinations of compounds and metals. The exemplary temperatures and durations of FIG. 5 have been found to be satisfactory for use with Pyro-Duct™ 597-C to form a cathode for use with the NEXUS DLC-X Diamond-Like Carbon System of Veeco Instruments Inc. Other compounds that may be satisfactory for use as the base layer on the cathode within at a least some deposition systems and methods include: Pyro-Duct™ 598-A (which is a nickel-filled adhesive) and 598-C (which is a nickel-filled coating). Other compounds from other companies may be satisfactory as well, and the Aremco Products, Inc. products identified herein are merely exemplary.

Exemplary Slider for Storage Device with DLC Coating

A DLC film may be coated onto components or devices of an HDD and, for the sake of completeness, a brief description will now be provided of an exemplary HDD that has a slider where at least one surface of the slider is coated in a DLC film formed using a pulsed cathodic arc deposition process having a cathode configured as described above. The particular example of an HDD configured for heat assisted magnetic recording (HAMR), but DLC films may be used in other HDD designs with other recording technologies and a slider is just one component of an HDD component that may have a DLC film coating. Hence, the following is merely illustrative and not limiting.

Figure 6:
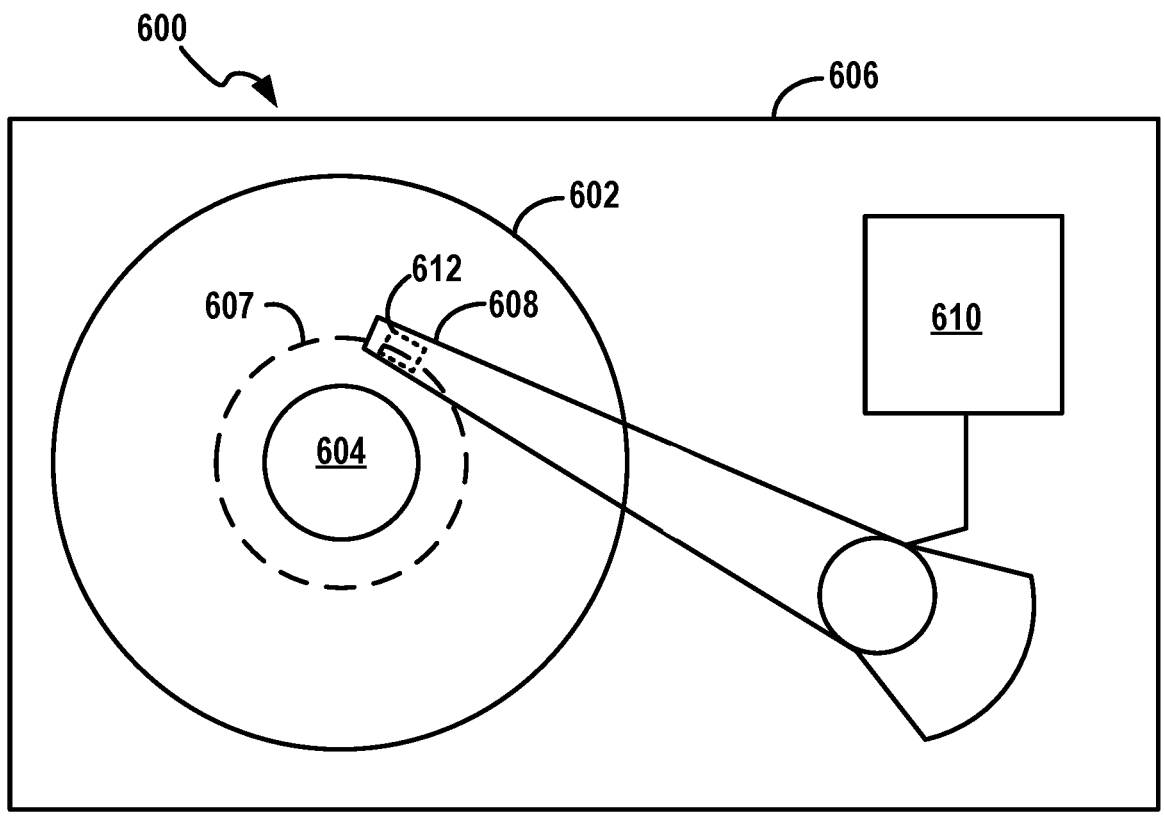
FIG. 6 illustrates an exemplary a disk drive having a slider on which a diamond like carbon (DLC) film may be deposited by a deposition system using the cathodes of FIGS. 1-4.

FIG. 6 illustrates a disk drive 600 configured for HAMR. The disk drive 600 includes one or more media 602, a spindle assembly 604, a drive housing 606, a slider 608 and control circuitry 610. The slider 608 may include a slider head 612 (shown in dashed lines as it is formed on the underside of the distal end of the slider 608. The slider 608 may be used to position a laser (not shown in FIG. 6). The one or more media 602 may be configured to store data. The media 602 may be a magnetic recording medium, such as a HAMR medium, in the form of a disk, or any other suitable means for storing data. The media 602 is positioned on the spindle assembly 604 that is mounted to the drive housing 606. Data may be stored along tracks in the magnetic recording layer of the media 602. The reading and writing of data are accomplished with a read element and a write element located with the slider 608. The write element is used to alter the properties of the magnetic recording layer of the media 602 and thereby write information thereto. In some implementations, the slider 608 may include an inductive read/write head or a Hall Effect head. During operation of the disk drive 600, a spindle motor (not shown) rotates the spindle assembly 604, and thereby rotates the media 602. The slider 608 and the laser (not shown) may be positioned over the media 602 at a particular location along a desired disk track, such as track 607 shown in dashed lines. The positions of the slider 608 and the laser relative to the media 602 may be controlled by the control circuitry 610.

Figure 7:
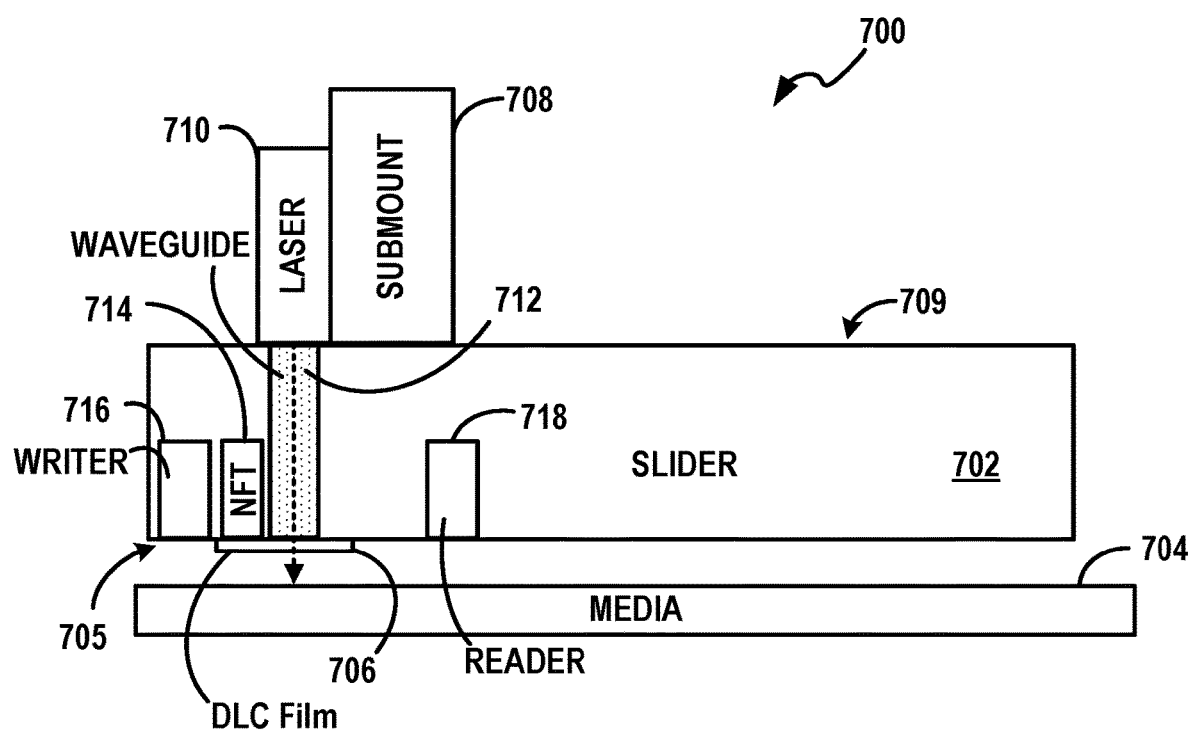
FIG. 7 illustrates an exemplary assembly of components for use within a disk drive that includes a slider on which a DLC film may be deposited using the cathodes of FIGS. 1-4.

FIG. 7 illustrates a side view of an exemplary assembly 700 that includes a slider 702 and a HAMR medium 704 where a bottom surface 705 of the slider 702 includes a DLC coating 706 formed using a pulsed cathodic arc deposition process having a cathode configured as described above. In the example of FIG. 7, the DLC coating 706 extends over only one exemplary portion of the bottom surface 705 of the slider 702 but, additionally or alternatively, other portions of the slider (or other components of assembly 700) may have DLC coatings or films as well. The DLC coating 706 is not shown to scale. The assembly 700 also includes a sub-mount 708, a laser 710, a waveguide 712, a near-field transducer (NFT) 714, a writer 716 and a reader 718. The assembly 700 is positioned over the HAMR media 704. The slider 702 may be one component or several components. For example, the slider 702 may include a slider and a slider head (not separately shown). In some implementations, the slider head may be a separate component mounted to the slider 702. In some examples, the DLC coating 706 may be formed on the slider head. The sub-mount 708, the laser 710, the waveguide 712, the NFT 714, the writer 716 and the reader 718 may be implemented in the slider, the slider head or combinations thereof.

The bottom (first) surface 705 of the slider 702 faces the media 704. The bottom surface 705 may be referred to as an air bearing surface (ABS). The slider 702 also includes a top (second) surface 709 that faces away from the media 704. The sub-mount 708 is coupled to a top surface 709. The laser 710 is coupled to the sub-mount 708, and in some examples, to the slider 702. The waveguide 712, the NFT 714, the writer 716 and the reader 718 may be located near or along the ABS 705 of the slider 702. The writer 716 may be configured as a writing element or means for writing data on the media 704, and the reader 718 may be configured as a reading element or means for reading data on the media 704.

The laser 710 is configured to generate and transmit light energy (e.g., a laser beam) into the waveguide 712, which directs light energy to and/or near the NFT 714, which is near the ABS 705 of the slider 702. Upon receiving and/or being near the light energy, the NFT 714 may cause a portion of the media 704 to heat up, and/or the light energy traveling through the waveguide may heat a portion of the media 704. For example, upon receiving and/or being near the light energy, the NFT 714 may generate localized heat that heats a portion of the media. Thus, the light energy may travel through the waveguide 712 such that the NFT 714 emits heat to a portion of the media 704. In the example of FIG. 7, the DLC coating 706 is positioned so at least a portion of the heat and/or light energy passes through the DLC coating 706 (which is configured to be sufficiently thin to permit the portion of heat and/or light energy to pass through it). In other examples, the DLC coating may be positioned elsewhere on the bottom (ABS) surface 705 of the slider 702.

Additional Exemplary Structures and Methods

Figure 8:
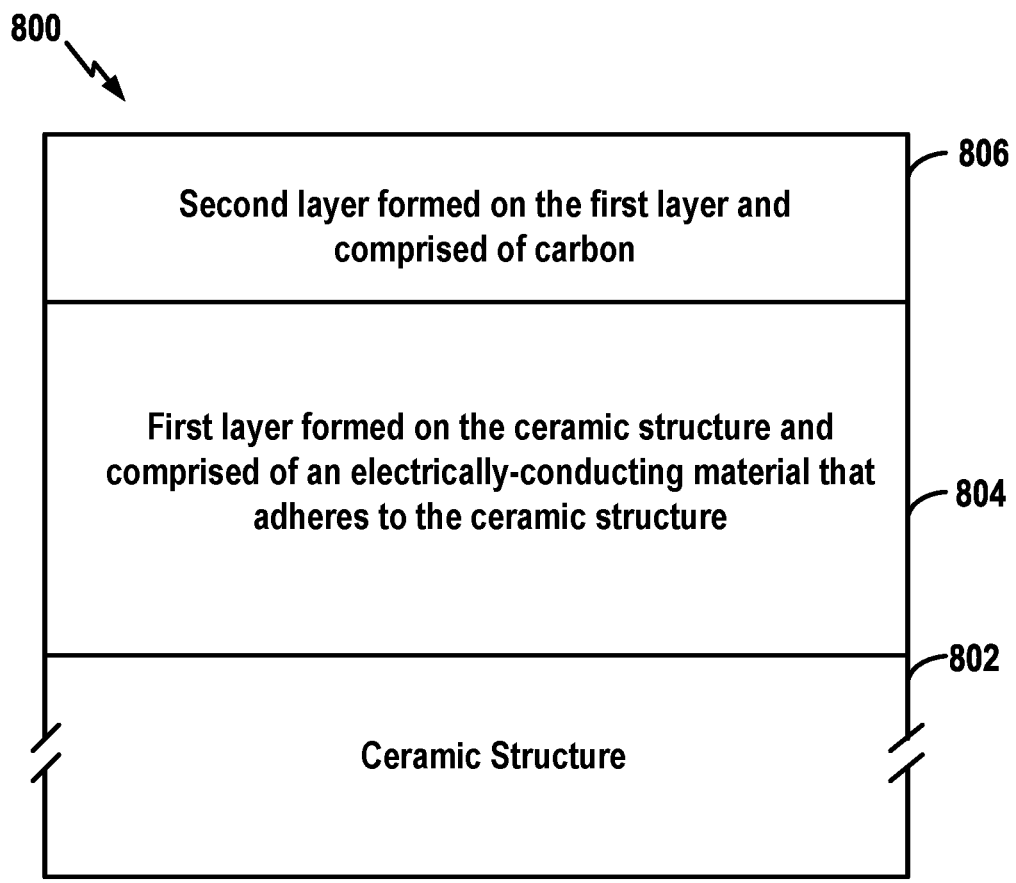
FIG. 8 illustrates an exemplary cathode structure for use in a deposition apparatus.

FIG. 8 illustrates an exemplary cathode structure 800 that includes a ceramic structure 802, a first layer 804 formed on the ceramic structure 802 and comprising an electrically-conducting material that adheres to the ceramic structure, and a second layer 806 formed on the first layer and comprising carbon, such as a carbon in the form of graphite. The cathode structure 800 may be used in a deposition system, such as a puled cathodic arc deposition system.

Figure 9:
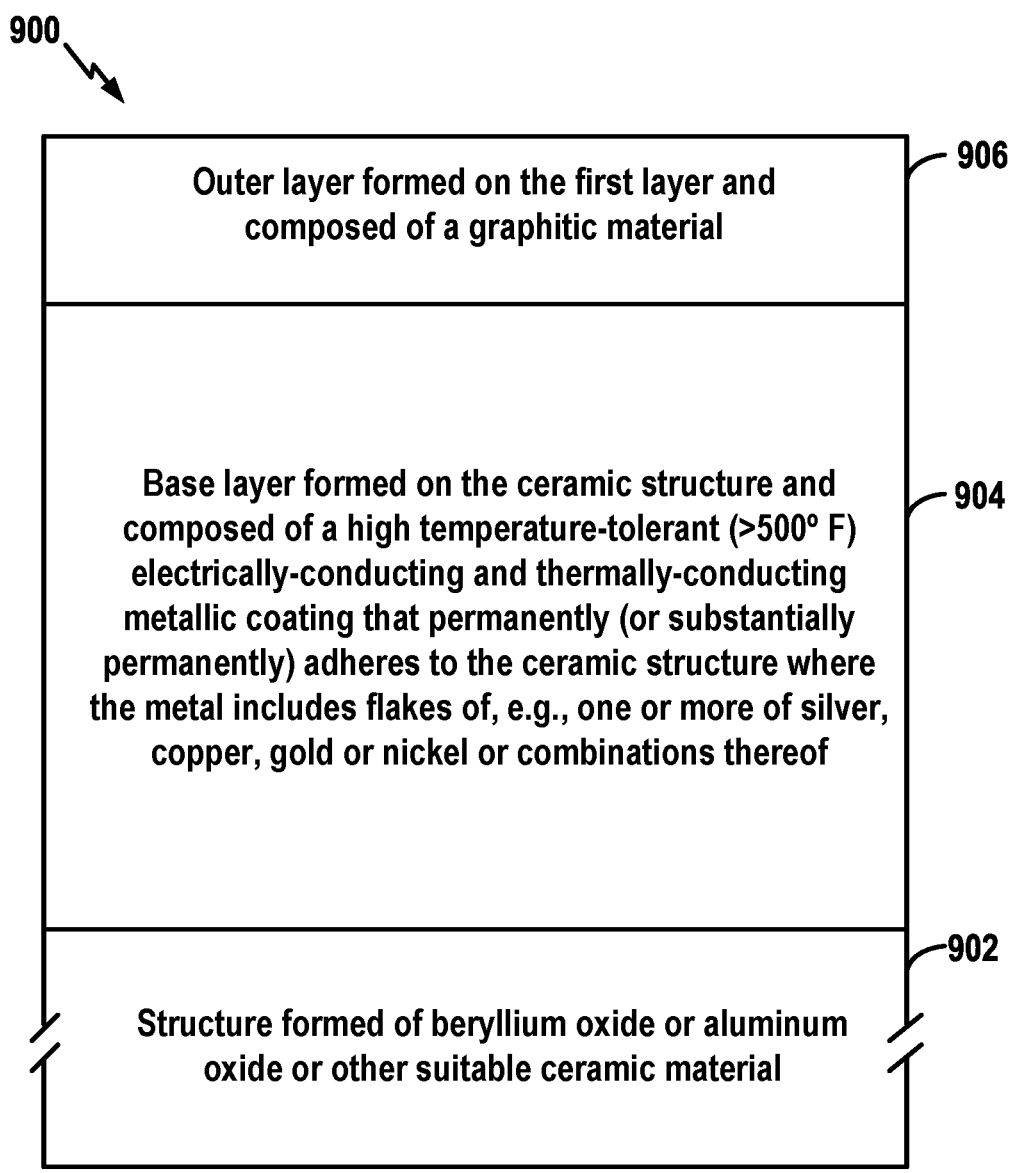
FIG. 9 illustrates another exemplary cathode structure for use in a deposition apparatus.

FIG. 9 illustrates an exemplary cathode structure 900 that includes: a ceramic structure 902 formed of beryllium oxide or aluminum oxide or other suitable ceramic material; a base layer 904 formed on the ceramic structure 902 and composed of a high temperature-tolerant (e.g. >500° F.) electrically-conducting and thermally-conducting metallic (or metal-filled) coating that permanently (or substantially permanently, e.g. for a sufficiently long time for practical pulsed cathodic arc deposition purposes) adheres to the ceramic structure, where the metal includes, e.g., one or more of silver, copper, gold, or nickel or combinations thereof; and an outer layer 906 formed on the base layer and composed of a graphitic material. (By a metallic or metal-filled coating, it is meant that the coating includes at least some metal among its other constituents, such as an amount of metal in the range of 10% to 90% of the coating, e.g., 10%, 50%, 75%, etc. For a particular application, a suitable or efficacious percentage of the metal can be determined via otherwise routine testing to achieve target electrical and/or thermal characteristics, such as a target conductivity. Particularly examples are disclosed elsewhere herein.) The cathode structure 900 may be used in a deposition system, such as a pulsed cathodic arc deposition system.

Figure 10:
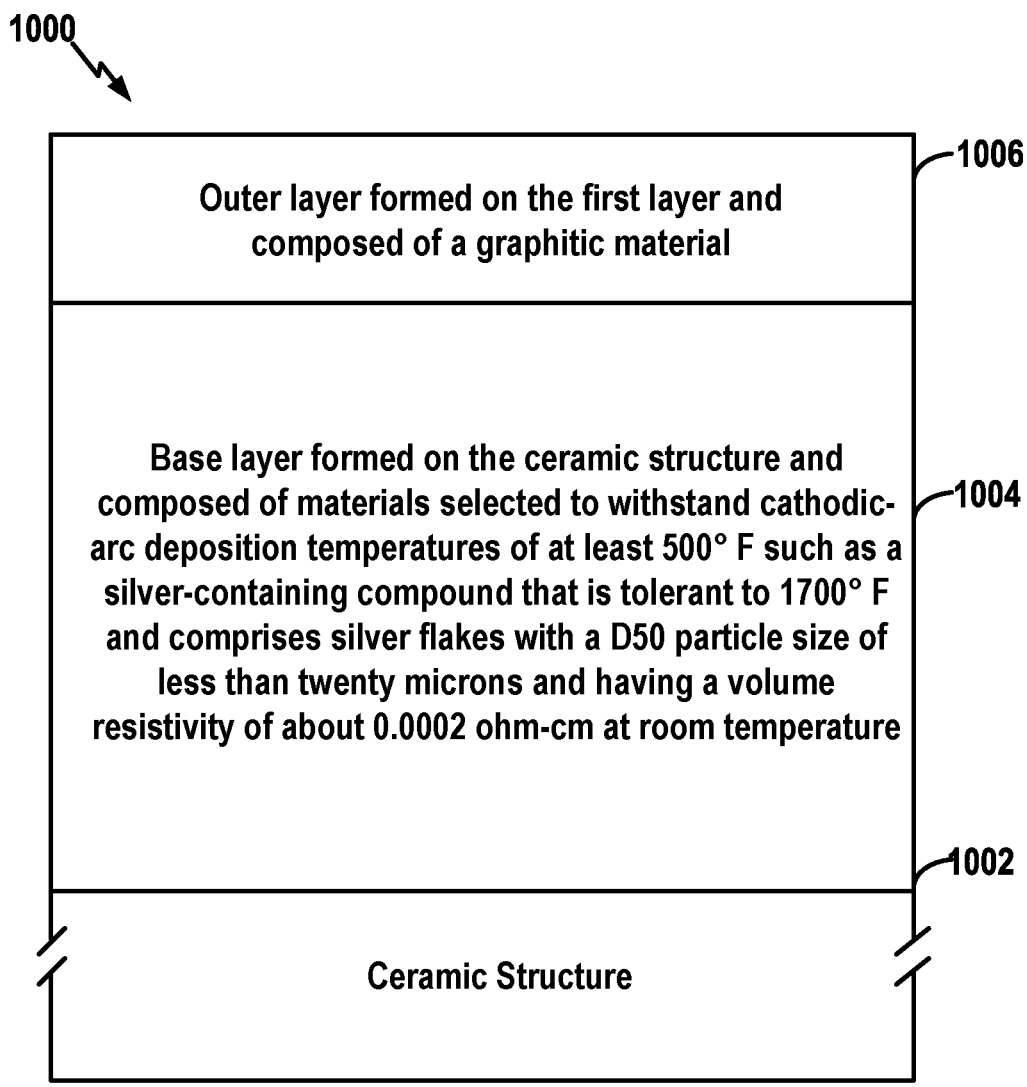
FIG. 10 illustrates yet another exemplary cathode structure for use in a deposition apparatus.

FIG. 10 illustrates an exemplary cathode structure 1000 that includes: a ceramic structure 1002; a base layer 1004 formed on the ceramic structure 1002 and composed of materials selected to withstand cathodic-arc deposition temperatures of at least 500° F. such as a silver-containing coating or adhesive that is tolerant to 1700° F. and comprises silver flakes with a D50 particle size of less than twenty microns and having a volume resistivity of about 0.0002 ohm-cm at room temperature; and an outer layer 1006 formed on the base layer and composed of a graphitic material. The cathode structure 1000 may be used in a deposition system, such as a pulsed cathodic arc deposition system. As explained above, other types of metallic compounds such as coatings or adhesives with metal flakes may be used in at least some deposition systems and methods.

Figure 11:
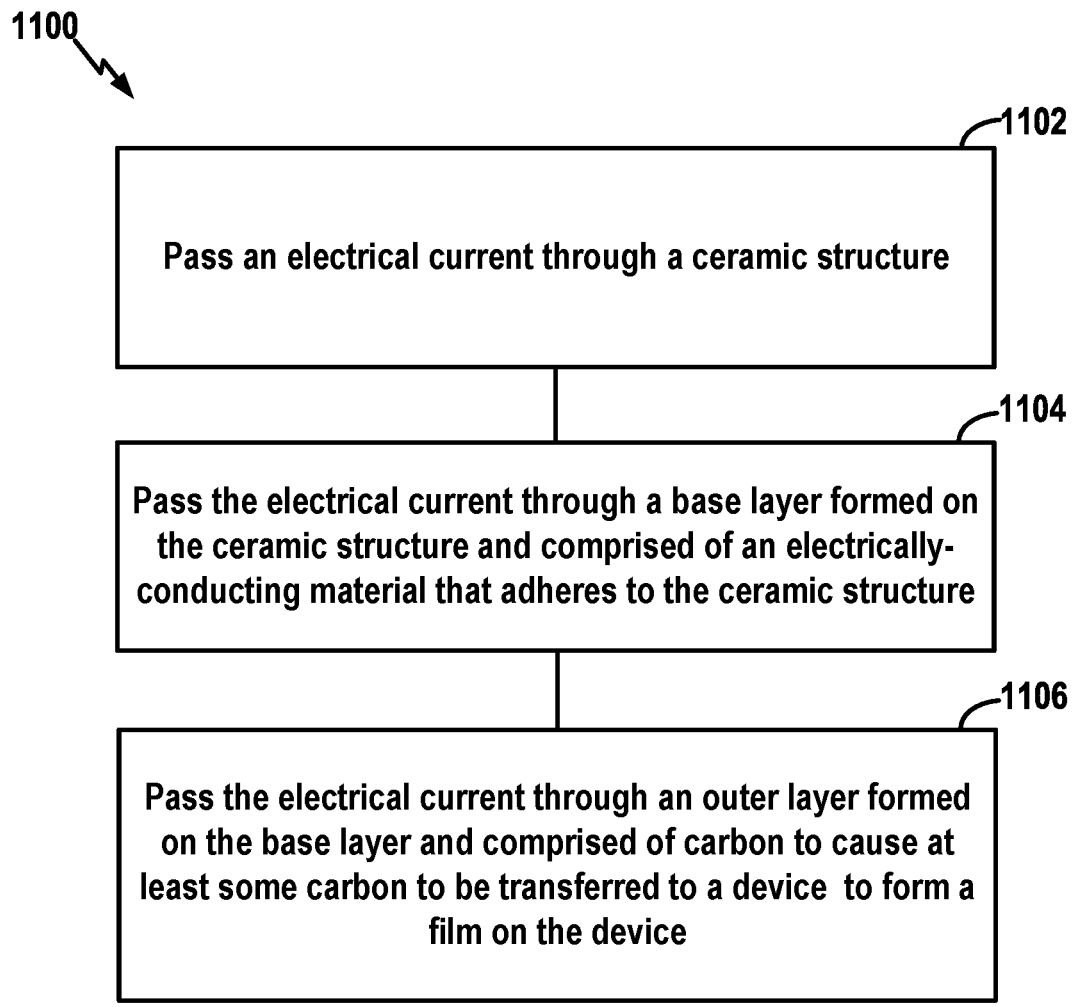
FIG. 11 is a flow chart summarizing an exemplary method or procedure for forming a film or coating.

FIG. 11 illustrates an exemplary method or procedure 1100 for forming a film or coating. At block 1102, a pulsed cathodic arc deposition system or other suitable deposition apparatus routes an electrical current through a ceramic structure of a cathode. At block 1104, the deposition apparatus routes the electrical current through a base layer formed on the ceramic structure and comprised of an electrically-conducting material that adheres to the ceramic structure. At block 1106, the deposition apparatus routes the electrical current through an outer layer formed on the base layer and comprised of carbon to cause at least some carbon to be transferred to a device to form a film on the device. It is noted that, with the cathode structure used in conjunction with a separate anode, current may be regarded as flowing into the ceramic structure of the cathode from a current source, then through the base layer, then through the outer carbon layer and then to the anode (through a plasma). Electrical current flow is in the opposite direction.

Figure 12:
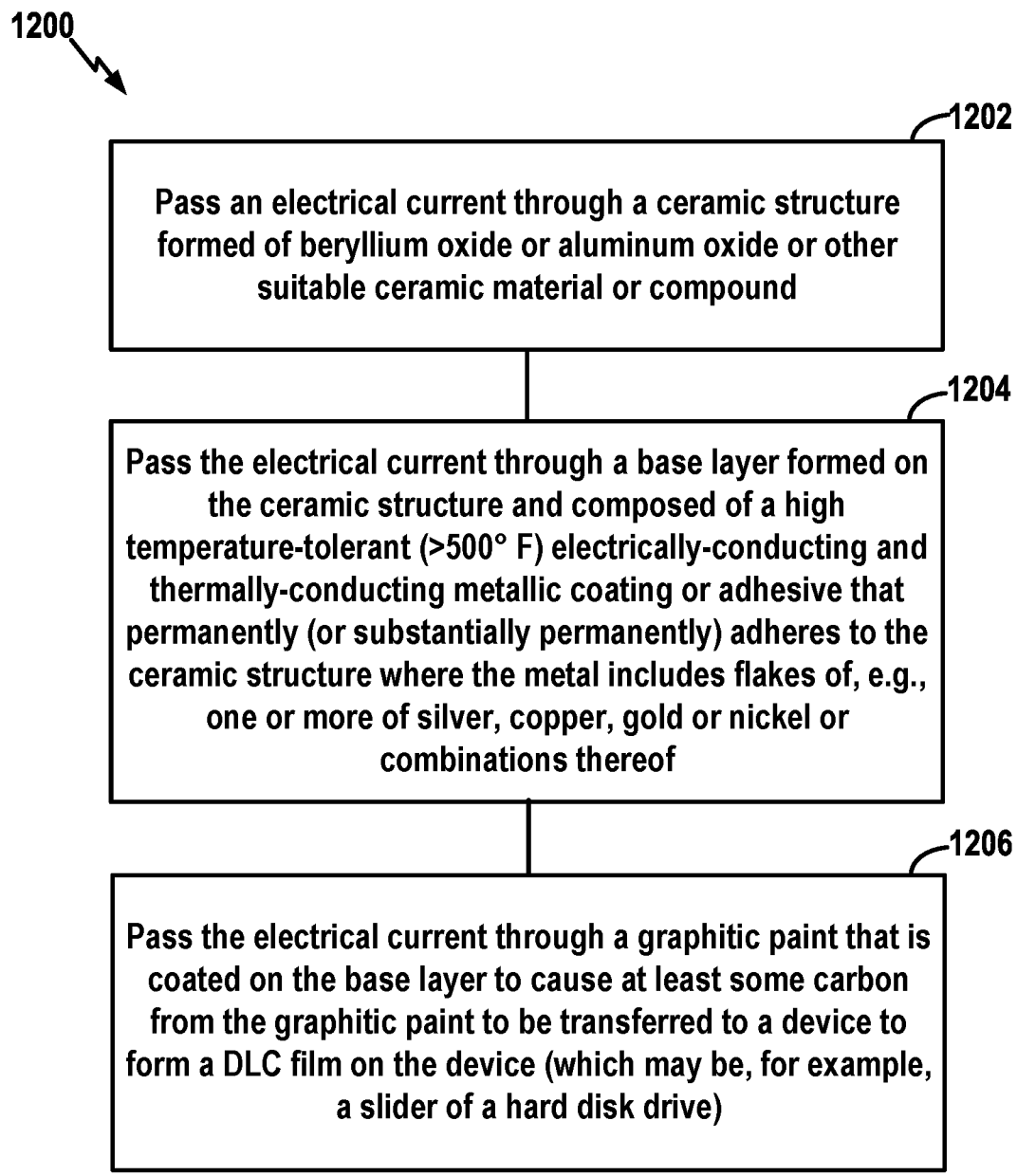
FIG. 12 is a flow chart summarizing another exemplary method or procedure for forming a film or coating.

FIG. 12 illustrates an exemplary method or procedure 1200 for forming a film or coating. At block 1202, a pulsed cathodic arc deposition system or other suitable deposition apparatus routes an electrical current through a ceramic structure formed of beryllium oxide or aluminum oxide or other suitable ceramic material or compound. At block 1204, the deposition apparatus routes the electrical current through a base layer formed on the ceramic structure and composed of a high temperature-tolerant (>500° F.) electrically-conducting and thermally-conducting metallic coating or adhesive (such as a metallic paint) that permanently (or substantially permanently) adheres to the ceramic structure where the metal includes flakes of, e.g., one or more of silver, copper, gold or nickel or combinations thereof. At block 1206, the deposition apparatus routes the electrical current through a graphitic paint layer formed on the base layer to cause at least some carbon from the graphitic paint to be transferred to a device to form a DLC film or coating on the device. The device may be, for example, the slider of a HDD.

Figure 13:
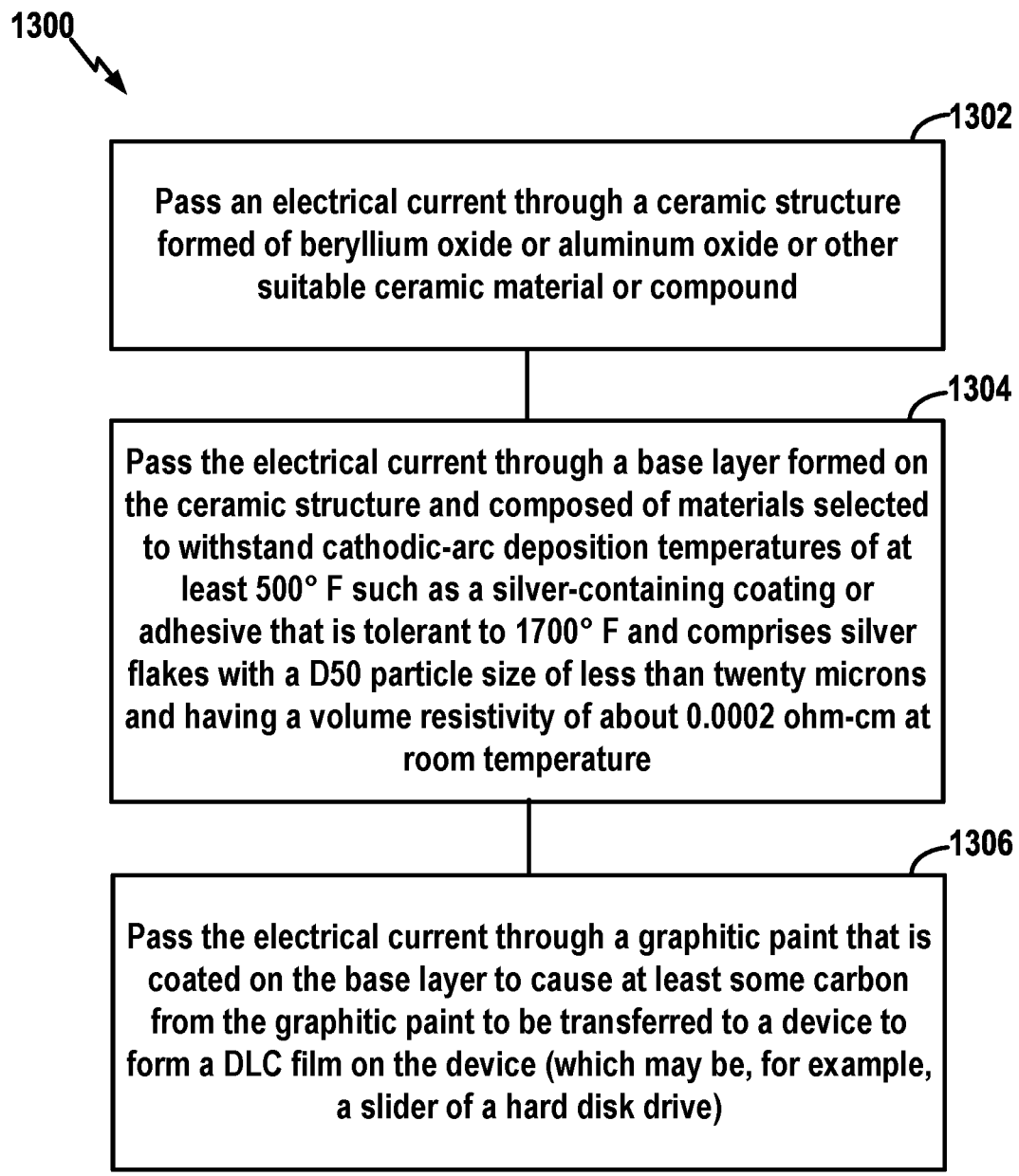
FIG. 13 is a flow chart summarizing another exemplary method or procedure for forming a film or coating.

FIG. 13 illustrates an exemplary method or procedure 1300 for forming a film or coating. At block 1302, a pulsed cathodic arc deposition system or other suitable deposition apparatus routes an electrical current through a ceramic structure formed of beryllium oxide or aluminum oxide or other suitable ceramic material or compound. At block 1304, the deposition apparatus routes the electrical current through a base layer formed on the ceramic structure and composed or comprised of materials selected to withstand cathodic-arc deposition temperatures of at least 500° F., such as a silver-containing compound that is tolerant to 1700° F., which includes silver flakes with a D50 particle size of less than twenty microns and having a volume resistivity of about 0.0002 ohm-cm at room temperature. At block 1306, the deposition apparatus routes the electrical current through a graphitic paint layer formed on the base layer to cause at least some carbon from the graphitic layer to be transferred to a device to form a DLC film or coating on the device. The device may be, for example, the slider of a HDD.

Figure 14:
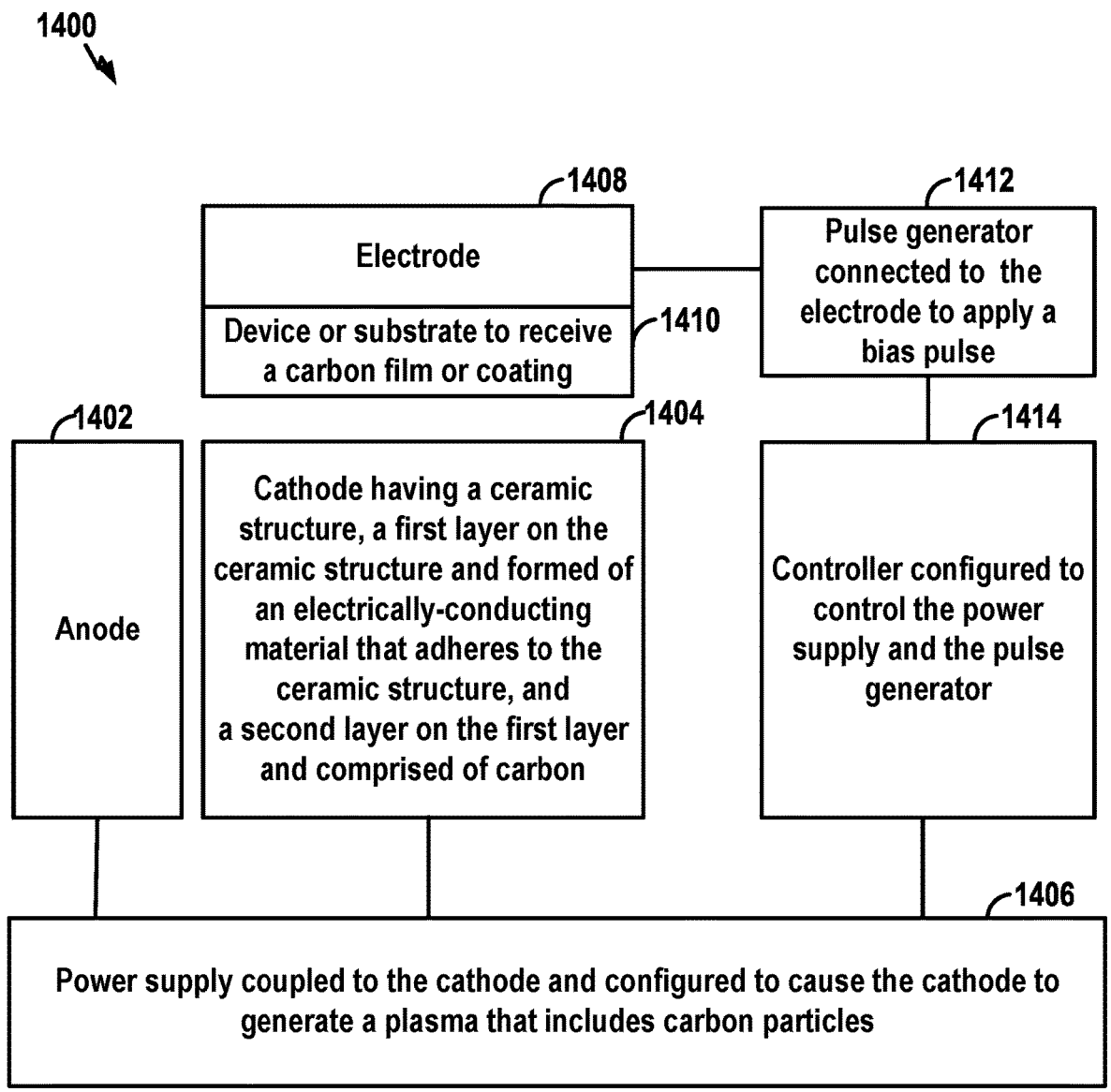
FIG. 14 is a block diagram illustrating an exemplary deposition apparatus having a cathode structure as in FIG. 8.

FIG. 14 is a block diagram illustrating an exemplary pulsed cathodic arc deposition system or apparatus 1400 for forming a film or coating on a device or substrate. The deposition apparatus 1400 includes an anode 1402 and a cathode 1404 having a ceramic structure, a first layer formed on the ceramic structure where the first layer is an electrically-conducting material that adheres to the ceramic structure, and a second layer formed on the first layer and composed or comprised of carbon, such as graphite. A power supply 1406 is coupled to the anode 1402 and the cathode 1404 and configured to cause the cathode 1404 to generate a plasma (not shown) that includes carbon particles for deposition. The deposition apparatus also includes an electrode 1408 on which a device or substrate to receive a carbon film or coating is mounted. A pulse generator 1412 is connected to the electrode 1408 to apply one or more bias pulses. A controller 1414 is configured to control the power supply 1406 and the pulse generator 1412 to, for example, cause the cathode 1404 to generate a plasma that includes carbon particles that are then deposited on the device or substrate 1410 in a controlled manner to have desired or selected properties, such as thickness, density, hardness, etc. Note that the block diagram of FIG. 14 does not illustrate all components that may be included in a pulsed cathodic arc deposition system or apparatus. For example, magnetic containment components may be provided to contain the plasma and guide the carbon particles in a controlled manner to the device or substrate for deposition thereon.

At least some of the components and devices described herein may be configured using any suitable means for performing the associated function. By way of example, an apparatus for forming a film may include: a means for passing an electrical current through a ceramic structure; a means for passing the electrical current through a first layer formed on the ceramic structure and comprised of an electrically-conducting material that adheres to the ceramic structure; and a means for passing the electrical current through a second layer formed on the first layer and comprised of graphite to cause at least some carbon from the graphite to be transferred to a substrate to form a film on the substrate.

Additional Exemplary Cathode Structures with Base Coatings

Figure 15:
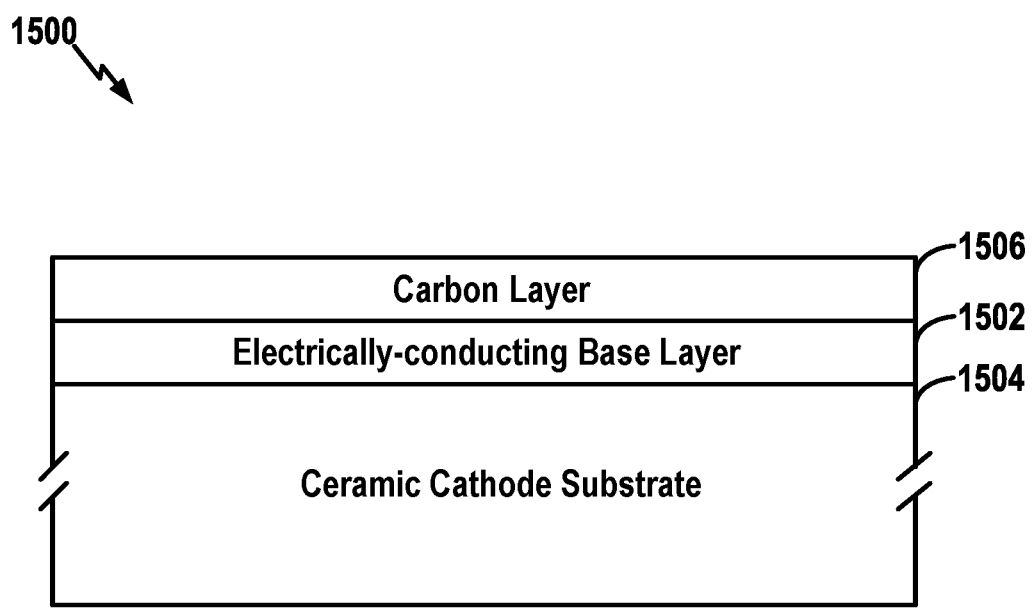
FIG. 15 illustrates an exemplary cathode structure where the cathode structure includes an electrically-conducting base layer and a carbon layer.

FIG. 15 illustrates an exemplary cathode structure 1500 that includes an electrically-conducting base layer or coating 1502 between a ceramic substrate 1504 of the cathode and a carbon layer 1506. The electrically-conducting base layer 1502 may be, e.g., a silver-containing layer or coating, such as the silver-containing layers or coatings discussed above. The carbon layer 1506 may be, e.g., a graphitic coating, such as the graphitic paint discussed above. In implementations where the ceramic substrate 1504 is in the shape of a tube or rod, the ceramic substrate and the layers coated thereon may be curved, and the electrically-conducting base layer 1502 and the carbon layer 1506 may be applied to coat both the outer surface of a distal end of the ceramic and an inner surface of the distal end of the ceramic (as shown in FIG. 16, discussed next).

Figure 16:
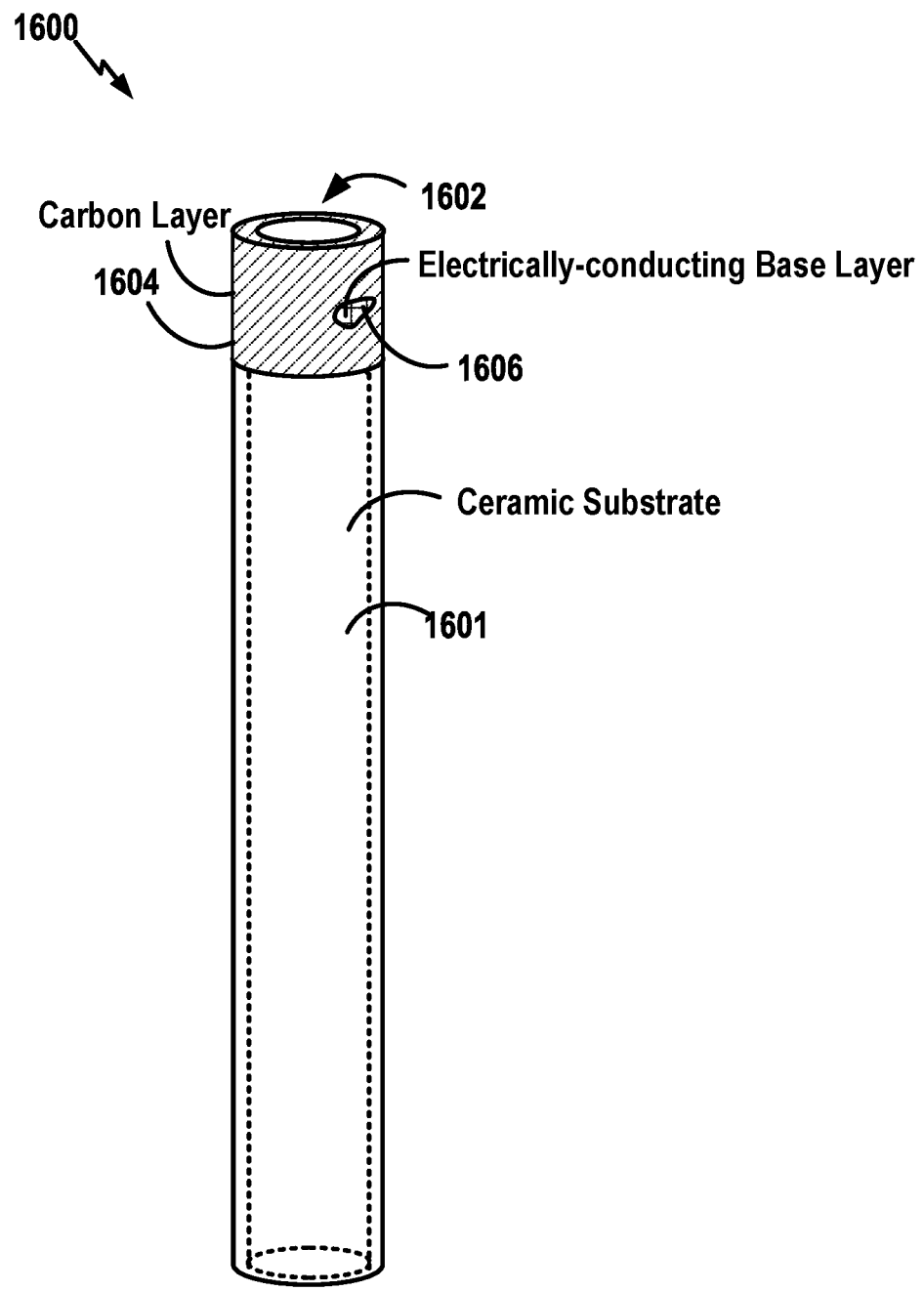
FIG. 16 illustrates a rod-shaped cathode structure with an electrically-conducting base layer and a carbon layer.

FIG. 16 illustrates a coated ceramic cathode tube or rod 1600 formed of a ceramic substrate material 1601 having an open distal end 1602, where the coating includes an outer carbon layer 1604 (shown using a diagonal hatch pattern) and an electrically-conducting base layer 1606 (shown using a square cross hatch pattern). In the figure, a portion of the outer carbon layer 1604 is shown cut open so that a portion of the inner electrically-conducting base layer 1606 can be seen. This is for illustrative purposes only. It is noted that, in this example, both the inner and outer surfaces of the open distal end 1602 of the ceramic tube 1600 are coated with the two-layer coating 1604/1606. The carbon layer 1604 may be, e.g., a graphitic coating, such as the graphitic paint discussed above. The electrically-conducting base layer 1606 may be, e.g., a silver-containing layer or coating, such as the silver-containing layers or coatings discussed above.

Figure 17:
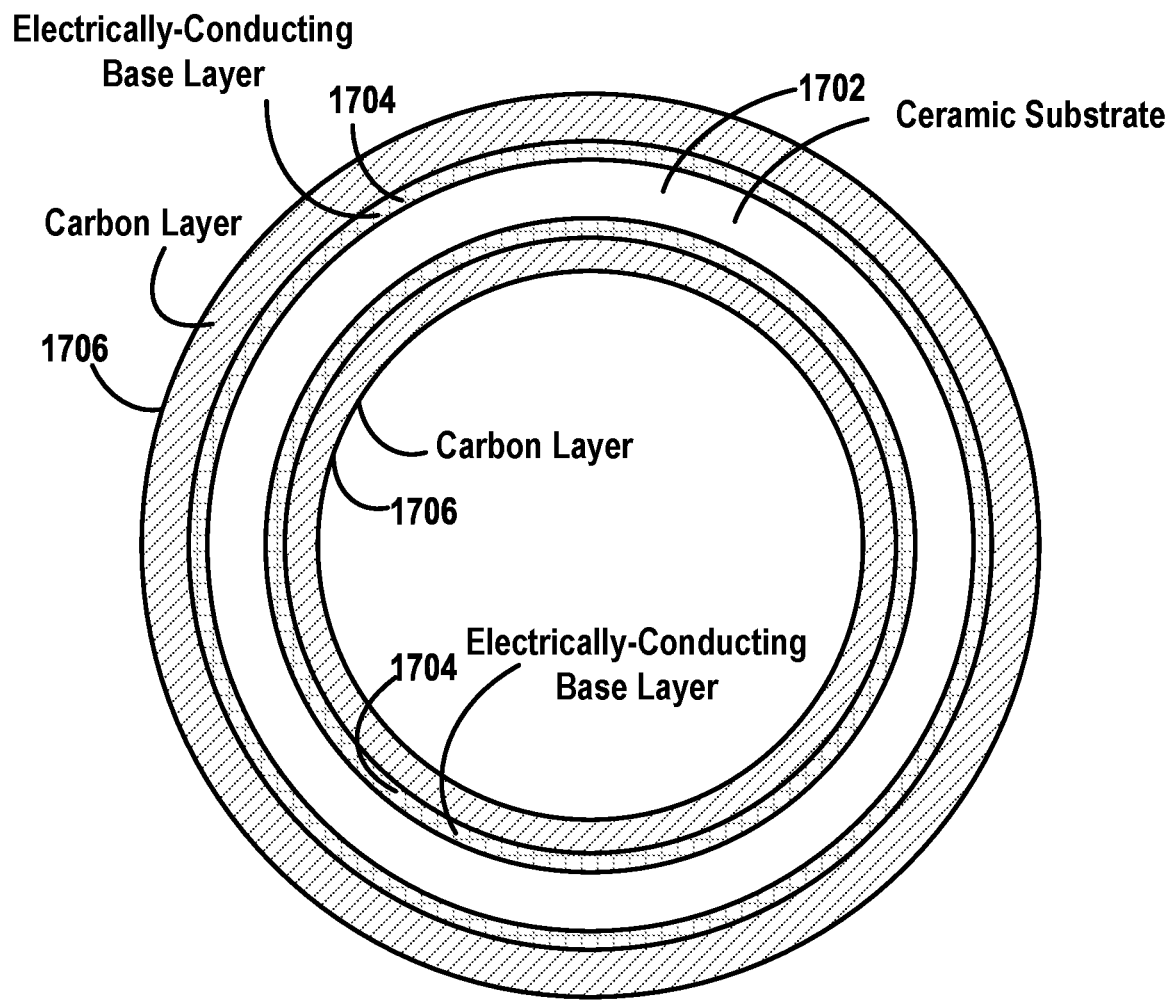
FIG. 17 illustrates a cross-section of a distal end of the exemplary rod-shaped cathode structure of FIG. 16 with the cross-section taken perpendicular to a long axis of the cathode.

FIG. 17 is a cross-sectional illustration of a slice of the distal end of an exemplary cathode rod or tube 1700 having a ceramic substrate 1702 shaped in the form of a tube or cylinder, with the cross-section taken through the distal end and perpendicular to a long axis of the tube. A thin electrically-conducting base layer 1704 (shown using a square cross-hatch pattern) is formed or coated onto both the inner and outer surfaces of the open distal end of the ceramic substrate 1702. A carbon layer 1706 (shown again using a diagonal hatch pattern) is formed or coated onto the conducting layer 1704. The carbon layer 1706 may be, e.g., a graphitic coating, such as the graphitic paint discussed above. The electrically-conducting base layer 1704 may be, e.g., a silver-containing layer or coating, such as the silver-containing layers or coatings discussed above. Note that the illustration of FIG. 17 is not to scale.

Figure 18:
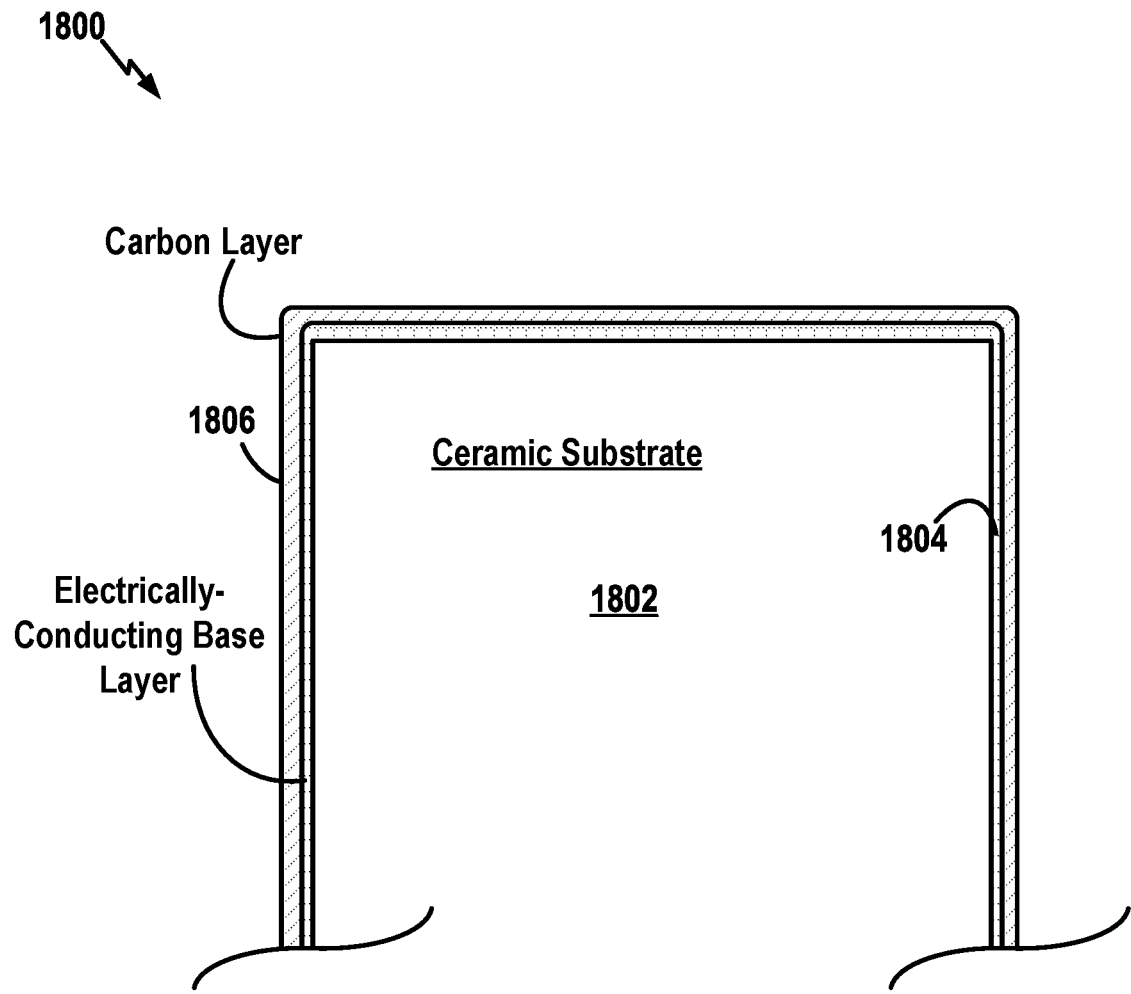
FIG. 18 illustrates a longitudinal cross-section of one side of the distal end of the exemplary cathode structure of FIG. 16 with the cross-section taken parallel to the long axis.

FIG. 18 is a cross-sectional illustration of one end portion of the distal end an exemplary cathode rod or tube 1800 such as one configured as in FIG. 18, with the cross-section taken parallel with a long axis of the tube. As shown, the electrically-conducting base layer 1804 (shown again using a square cross-hatch pattern) and the carbon layer 1806 (shown again using a diagonal hatch pattern) extend around a distal end of the ceramic substrate 1802. Note that FIG. 18 shows a cross section through only one portion of the distal end of cylindrical ceramic tube. The diametrically opposite portion is not shown in FIG. 18 but has the same components and layers. The carbon layer 1806 may be, e.g., a graphitic coating, such as the graphitic paint discussed above. The electrically-conducting base layer 1804 may be, e.g., a silver-containing layer or coating, such as the silver-containing layers or coatings discussed above. The illustration of FIG. 18 is not to scale.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable or machine readable medium having stored thereon computer executable instructions that when executed by a computer (e.g., a processor) control the computer to perform the functionality described herein. Examples of machine readable media suitable for implementing the subject matter described herein include non-transitory computer-readable media, such as disk memory devices, chip memory devices, programmable logic devices, and application specific integrated circuits. In addition, a machine readable medium that implements the subject matter described herein may be located on a single device or computing platform or may be distributed across multiple devices or computing platforms.

By way of example, a machine-readable storage medium may have one or more instructions which when executed by a controller (such as controller 1414 of FIG. 14) causes the controller to: route an electrical current through a ceramic structure; route the electrical current through a first layer formed on the ceramic structure and comprised of an electrically-conducting material that adheres to the ceramic structure; and route the electrical current through a second layer formed on the first layer and comprised of graphite to cause at least some carbon from the graphite to be transferred to a substrate to form a film on the substrate.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

Certain components (including layers, coatings, or other components) listed herein may be described as "comprising," "made of," "including," or similar such terms, a material or a combination of materials. In one aspect, each of those components may also consist of that material or the combination of materials. In another aspect, each of those components may also consist essentially of that material or the combination of materials.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

If used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" is intended to cover A, B, C, A-B, A-C, B-C, and A-B-C, as well as multiples of the same members (e.g., any lists that include AA, BB, or CC). Likewise, "at least one of: A, B, and C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A method for forming a film, the method comprising:
passing an electrical current through a ceramic structure comprising a cylindrical tube;
passing the electrical current through a base layer formed on an inner-facing surface and on an outer-facing surface of the cylindrical tube and comprised of a metallic coating that adheres to the ceramic structure; and
passing the electrical current through an outer layer formed on an inner-facing surface and on an outer-facing surface of the base layer and comprised of carbon to cause at least some of the carbon to be transferred to a device to form a film on the device.

2. The method of claim 1, wherein the metallic coating comprises a silver-containing coating.

3. The method of claim 2, wherein the silver-containing coating comprises silver flakes with a D50 particle size of less than twenty microns.

4. The method of claim 2, wherein the silver-containing coating has a volume resistivity of about 0.0002 ohm-cm at room temperature.

5. The method of claim 1, wherein the metallic coating comprises metal flakes.

6. The method of claim 1, wherein a metal of the metallic coating is selected from a group consisting of one or more of silver, nickel, copper and gold.

7. The method of claim 1, wherein the metallic coating is formed of materials selected to withstand cathodic-arc deposition temperatures of at least 500° F.

8. The method of claim 1, wherein the film that is formed is a diamond-like carbon (DLC) film.

9. A method for forming a cathode structure for use in a deposition apparatus, the method comprising:
providing a ceramic structure comprising a cylindrical tube;
providing a first layer on an inner-facing surface and on an outer-facing surface of the cylindrical tube of the ceramic structure and comprising a metallic coating that adheres to the ceramic structure; and
providing an electrically-conducting second layer formed on an inner-facing surface and on an outer-facing surface of the first layer and comprising carbon.

10. The method of claim 9, wherein the providing the first layer on the inner-facing surface and on the outer-facing surface of the cylindrical tube of the ceramic structure comprises:
applying the first layer to the inner-facing surface and to the outer-facing surface of the cylindrical tube of the ceramic structure; and
applying a first heat to the ceramic structure at a preselected temperature and for a preselected duration, wherein the preselected temperature and the preselected duration are predetermined for a preselected contact resistance of the first layer.

11. The method of claim 10, further comprising:
applying the second layer to the inner-facing surface and to the outer-facing surface of the first layer after applying the first heat, wherein the second layer comprises a graphitic paint; and
applying a second heat to the ceramic structure with the graphitic paint at a preselected temperature and for a preselected duration.

12. The method of claim 11, further comprising:
applying a third heat to the ceramic structure with the graphitic paint at a preselected temperature and for a preselected duration, wherein the preselected temperature and the preselected duration of applying the third heat are predetermined for a preselected contact resistance of the graphitic paint.

13. The method of claim 9, wherein the metallic coating comprises a silver-containing coating.

14. The method of claim 13, wherein the silver-containing coating comprises silver flakes with a D50 particle size of less than twenty microns.

15. The method of claim 13, wherein the silver-containing coating has a volume resistivity of about 0.0002 ohm-cm at room temperature.

16. The method of claim 9, wherein a metal of the metallic coating is selected from a group consisting of silver, nickel, copper and gold.

17. The method of claim 9, wherein the metallic coating comprises metal flakes.

* * * * *